United States Patent
Dehm et al.

(10) Patent No.: US 6,228,701 B1
(45) Date of Patent: *May 8, 2001

(54) APPARATUS AND METHOD FOR MINIMIZING DIFFUSION IN STACKED CAPACITORS FORMED ON SILICON PLUGS

(75) Inventors: Christine Dehm, Munich (DE); Stephen K. Loh, Fishkill, NY (US); Carlos Mazuré, Zorneding (DE)

(73) Assignees: Seimens Aktiengesellschaft, Munich (DE); International Business Machines Corporation, Armonk, NY (US)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/994,275

(22) Filed: Dec. 19, 1997

(51) Int. Cl.[7] .................................. H01L 21/8242
(52) U.S. Cl. .................. 438/240; 438/253; 438/396; 438/658; 438/775; 438/922
(58) Field of Search ............... 438/775, 253, 438/396, 658, 922, 698, 155, 240, 220, FOR 220, FOR 207

(56) References Cited

U.S. PATENT DOCUMENTS

| | | | |
|---|---|---|---|
| 5,352,623 | * | 10/1994 | Kamiyama . |
| 5,418,388 | * | 5/1995 | Okudaira et al. . |
| 5,693,553 | * | 12/1997 | Kashihara et al. . |
| 5,696,015 | * | 12/1997 | Hwang . |
| 5,786,248 | * | 7/1998 | Schuegraf . |
| 6,037,235 | * | 3/2000 | Narwankar et al. . |
| 6,066,528 | * | 5/2000 | Fazan et al. . |
| 6,162,671 | * | 12/2000 | Lee et al. . |
| B1 6,171,925 | * | 1/2001 | Graettinger et al. . |

* cited by examiner

*Primary Examiner*—George Fourson
*Assistant Examiner*—Michelle Estrada
(74) *Attorney, Agent, or Firm*—Stanton Braden

(57) ABSTRACT

Methods and apparatus for fabricating stacked capacitor structures, which include barrier layers, are disclosed. According to one aspect of the present invention, a method for reducing outdiffusion within an integrated circuit includes forming a gate oxide layer over a substrate, and further forming a silicon plug over a portion of the gate oxide layer. A silicon dioxide layer is then formed over the gate oxide layer, and is arranged around the silicon plug. A first barrier film is formed over the silicon plug, and a dielectric layer is formed over the silicon dioxide layer. In one embodiment, forming the first barrier film includes forming a first oxide layer over the silicon plug, nitridizing the first oxide layer, and etching the nitridized first oxide layer.

40 Claims, 4 Drawing Sheets

APPARATUS AND METHOD FOR MINIMIZING DIFFUSION IN STACKED CAPACITORS FORMED ON SILICON PLUGS

BACKGROUND OF THE INVENTION

1. Field of Invention

The invention relates generally to methods and apparatus for integrating capacitors into integrated circuits. More particularly, the invention relates to methods and apparatus for reducing the amount of contaminants which migrate from a high dielectric layer of a stacked capacitor into silicon during processing of the stacked capacitor, and for reducing contaminants which migrate from silicon into the high dielectric layer.

2. Description of the Relevant Art

As the demand for integrated circuits, such as dynamic random access memory (DRAM) integrated circuits, increases, the need for efficiently produced integrated circuits is also increasing. Producing integrated circuits in such a way that the integrity of the integrated process may be protected throughout the fabrication process increases the overall throughput of the integrated circuits.

Many integrated circuits include capacitors, such as stacked capacitors. FIG. 1 is a diagrammatic cross-sectional representation of a stacked capacitor formed on an integrated circuit. A stacked capacitor structure 104 is typically included as part of an integrated circuit, e.g., a DRAM integrated circuit. Stacked capacitor structure 104 is formed over a substrate 106 of the integrated circuit. Substrate 106 is generally formed from silicon, and includes a junction region 107. Junction region 107 is generally a doped region in substrate 106 that is the source or the drain element of a FET. Substrate 106 may also include various other layers associated with the formation of an integrated circuit. By way of example, substrate 106 may include various insulating layers and conducting layers.

A polycrystalline silicon plug 110 overlays substrate 106. In general, polycrystalline silicon plug 110 may be doped using a dopant such as boron, phosphorous, or arsenic. A silicon dioxide layer 112 is located over substrate 106, and is arranged around polycrystalline silicon plug 110.

A bottom electrode 116 is disposed over polycrystalline silicon plug 110. An adhesion layer 114 is disposed between bottom electrode 116 and polysilicon plug 110 essentially to hold bottom electrode 116 in place. As shown, adhesion layer 114 also partially overlays silicon dioxide layer 112.

A layer of material with a relatively high dielectric constant 118, e.g., a "high dielectric layer," is arranged over bottom electrode 116 and portions of silicon dioxide layer 112. A top electrode 120 is conformally disposed over high dielectric layer 118. High dielectric layer 118 is generally arranged to insulate bottom electrode 116 from top electrode 120. Further, high dielectric layer 118 may increase charge holding capability of capacitor structure 104 and, hence, improve storage device operation.

When a capacitor, e.g., a stacked capacitor, is incorporated into an integrated circuit, materials in the high dielectric layer of the capacitor are likely to vertically diffuse into an underlying junction area during annealing processes which generally occur at temperatures of greater than approximately 800 degrees Centigrade. Materials in the high dielectric layer which may diffuse into the underlying junction area include, but are not limited to, materials such as lead zirconium titanate (PZT), barium strontium titanate (BST), and strontium bismuth titanate (SBT). When such materials diffuse out of the high dielectric layer, the integrity of the underlying junction area may be compromised. By way of example, leakage may occur in the junction area.

During annealing processes, such as those used to achieve desired dielectric properties, silicon from a polycrystalline silicon plug that is part of an overall stacked capacitor structure may diffuse vertically, as well as laterally, from the polycrystalline silicon plug into the high dielectric layer. When silicon diffuses into the high dielectric layer, compounds such as silicon oxide ($SiO_x$) may form, particularly at the interface between the high dielectric layer and the electrodes. Since silicon oxides are generally relatively high in resistance, and, further, have low dielectric constants, the formation of silicon oxides in a stacked capacitor may significantly degrade the overall dielectric properties of the capacitor.

Further, when the polycrystalline silicon plug is formed from doped polycrystalline silicon, dopants may diffuse from the polysilicon plug into the electrodes and the high dielectric layer, thereby altering the properties of the high dielectric layer. It has been observed that the amount of dopant which diffuses out of the doped polycrystalline silicon plug during annealing processes is greater than approximately 50 percent, as for example in the range of approximately 50 percent to approximately 70 percent, of the total amount of dopant in the doped polycrystalline silicon plug.

Reducing the thermal budget of an integrated circuit fabrication process, while generally effective in reducing diffusion within a stacked capacitor, often proves to be undesirable. For example, when the thermal budget is reduced, high temperature steps, i.e., steps which occur at temperatures of greater than approximately 800 degrees Centigrade, associated with the fabrication of an overall integrated circuit may be shortened. Such steps include reflowing dielectrics, and activating doped junctions, for example. Further, for DRAMS, reducing the number of dislocations which may be healed significantly compromises the retention time associated with the DRAM by increasing device leakage. Retention time is the time a DRAM cell retains its stored charge, and is limited by the rate that the stored charge leaks away.

Therefore, what is desired is a method and an apparatus for reducing contaminant outdiffusion and silicon diffusion in a stacked capacitor without compromising the integrity or the performance of an integrated circuit which includes the stacked capacitor.

SUMMARY OF THE INVENTION

Methods and apparatus for fabricating stacked capacitor structures, which include barrier layers, within an integrated circuit, are disclosed. According to one aspect of the present invention, a method for minimizing outdiffusion within an integrated circuit includes forming a source/drain region or a junction region on a substrate, and further forming a silicon plug over a source or drain region. A silicon dioxide layer is formed over the source/drain, and is then etched to form openings for the silicon plug. Once the silicon plug is formed, a first barrier film is formed over the silicon plug, a dielectric layer is formed over the silicon dioxide layer, and a first electrode is formed, including an adhesion layer. Finally, a second electrode is formed over the dielectric layer In one embodiment, forming the first barrier film includes forming a first oxide layer over the silicon plug, nitridizing the first oxide layer, and etching the nitridized first oxide layer. In such an embodiment, etching the nitridized first oxide layer exposes nitride at grain boundaries of the silicon plug. In another embodiment, forming the first barrier film includes performing a chemical vapor deposition to form an oxynitride film over the silicon plug and etching the oxynitride film to expose nitride at grain boundaries, especially grain boundaries near the top surface, of the silicon.

According to another aspect of the present invention, a stacked capacitor arrangement on an integrated circuit chip which has a junction region includes a silicon plug disposed over a portion of the junction region. A silicon dioxide layer is disposed over the junction region and at least partially around the silicon plug, and a first barrier film is formed over the silicon plug. A first electrode is secured over the silicon plug by an adhesion layer, and a layer of high dielectric material is disposed over the first electrode. In one embodiment, the silicon plug is a polysilicon plug, and the first barrier film includes nitride. In another embodiment, the layer of high dielectric material includes a contaminant, and the first barrier film is arranged to prevent the contaminant from diffusing from the layer of high dielectric material to the silicon plug.

According to yet another embodiment of the present invention, a capacitor arrangement on an integrated circuit chip includes a substrate with a junction region. A silicon plug structure is disposed over the junction region. A first barrier film is disposed between the silicon plug structure and an electrode arrangement. Finally, a layer of high dielectric material is disposed over the first barrier film. The high dielectric material includes at least one contaminant, and the first barrier film is arranged to obstruct passage of the contaminant from the layer of high dielectric material to the junction region.

These and other features and advantages of the present invention will be presented in more detail in the following detailed description of the invention and in the associated figures.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE EMBODIMENTS

The present invention will now be described in detail with reference to a few embodiments thereof as illustrated in the accompanying drawings. In the following description, numerous specific details are set forth in order to provide a thorough understanding of the present invention. It will be obvious, however, to one skilled in the art, that the present invention may be practiced without some or all of these specific details. In other instances, well known structures and steps have not been described in detail in order not to unnecessarily obscure the present invention.

In order to reduce the amount of materials diffused from a layer of high dielectric material in a stacked capacitor structure through to an underlying junction region during annealing processes, a barrier layer may be formed within the stacked capacitor structure. Such a barrier layer may also be effective to impede the diffusion of dopants and silicon from a polysilicon plug into the layer of high dielectric material, during annealing processes. In other words, a barrier layer may be effective to impede the diffusion of contaminants, dopants, and silicon between layers of a stacked capacitor structure.

Figure 1:
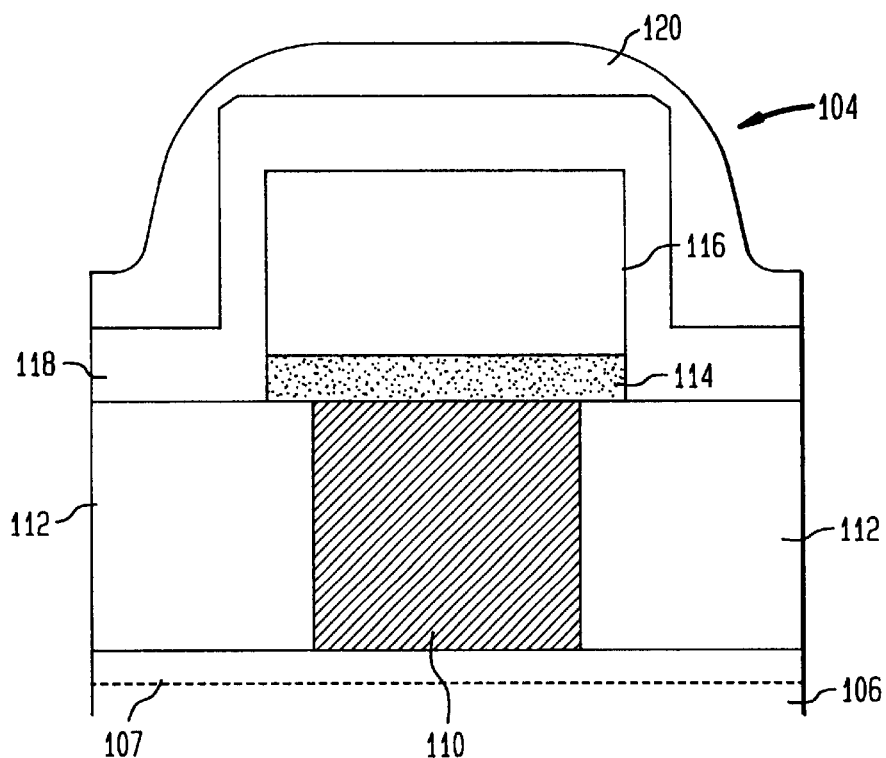
FIG. 1 is a diagrammatic cross-sectional representation of a stacked capacitor formed on an integrated circuit.
Figure 2:
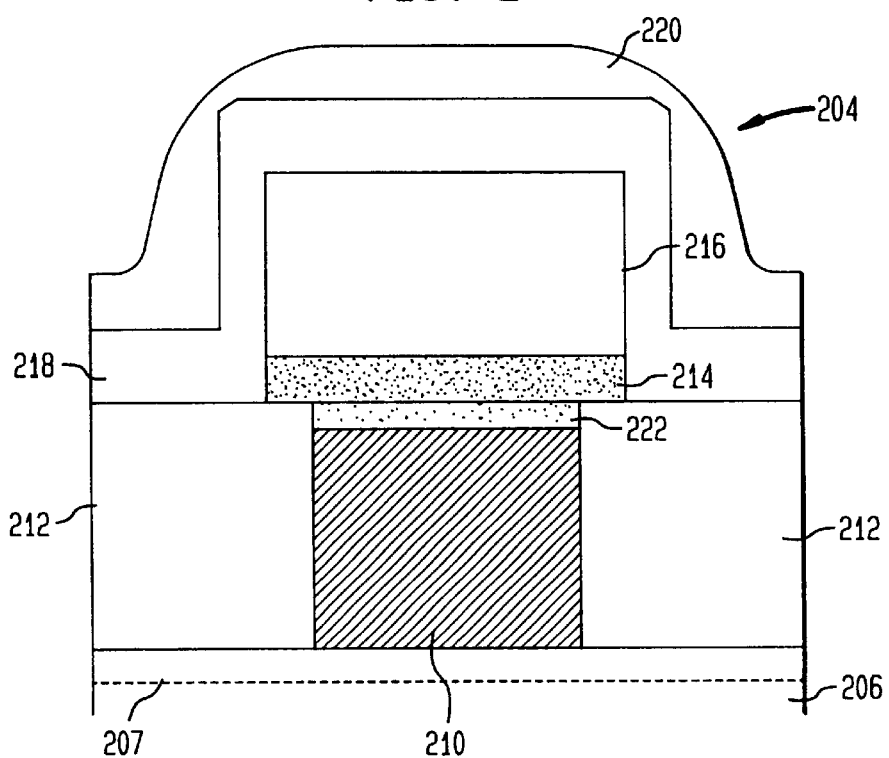
FIG. 2 is a diagrammatic cross-sectional representation of the layers in a stacked capacitor structure in an integrated circuit in accordance with an embodiment of the present invention.

FIG. 2 is a diagrammatic cross-sectional representation of the layers in a stacked capacitor structure in an integrated circuit in accordance with an embodiment of the present invention. It should be appreciated that for illustrative purposes, some features of the stacked capacitor structure have been exaggerated, while others have not been shown. A stacked capacitor structure 204 may be included as part of an integrated circuit such as a dynamic random access memory (DRAM), and includes a substrate 206. As will be appreciated by those skilled in the art, substrate 206 is generally the substrate of an integrated circuit or, more generally, the substrate of a semiconductor wafer. Substrate 206 is typically formed from silicon, may also include various other layers associated with the formation of gate structure 204 or, more generally, the integrated circuit of which gate structure 204 is a part. By way of example, substrate 206 may include insulating layers, conducting layers, and various junction regions, such as junction region 207. In one embodiment, junction region 207 may be doped.

A silicon plug 210 is formed over junction region 207. Silicon plug 210, which is typically formed from polycrystalline silicon, or "polysilicon," may be doped using a variety of different dopants including, but not limited to, boron, phosphorous, and arsenic.

In one embodiment, polysilicon plug 210 may be layered. That is, polysilicon plug 210 may be formed from different layers of doped or undoped polysilicon. One process for forming a layered polysilicon plug 210 will be described below with reference to FIG. 4. A barrier layer 222 is formed over polysilicon plug 210. The functionality of barrier layer 222 will be discussed below.

A silicon dioxide layer 212 is arranged around polysilicon plug 210. Silicon dioxide layer 212 is used to prevent polysilicon plug 210 from coming into contact with other device components such as adjacent devices or layers with high dielectric constants, as will be described below. A bottom electrode 216 is arranged over polysilicon plug 210. Bottom electrode may be formed from substantially any metallic material, as for example Pt, Ru, or $RuO_2$. The position of bottom electrode 216 in stacked capacitor structure 204 is generally maintained essentially by physically coupling bottom electrode 216 to polysilicon plug 210. In the described embodiment, an adhesion layer 214 is used to hold bottom electrode 216 with respect to polysilicon plug 210. As shown, adhesion layer 214 may also at least partially overlay silicon dioxide layer 212.

A layer of material with a relatively high dielectric constant 218, e.g., a "high dielectric layer," is arranged over bottom electrode 216 to insulate bottom electrode 216 from a top electrode 220. Top electrode 220 is conformally disposed over high dielectric layer 218. High dielectric layer 218 is generally arranged to insulate bottom electrode 116 from top electrode 120.

High dielectric layer 218 generally includes materials such as PZT, BST, and SBT. When such material diffuse into junction regions of substrate 206, contamination may occur, and high junction leakages in the junction regions, e.g., junction region 207, may occur, thereby affecting the overall performance of the integrated circuit in which stacked capacitor structure 204 is included. Barrier layer 222 is arranged to reduce the amount of diffusion between high dielectric layer 218 and other layers of stacked capacitor structure 204.

In the described embodiment, barrier layer 222 includes nitride, e.g., silicon oxynitride, which is located at the grain boundaries of polysilicon plug 210. Nitride is generally located at grain boundaries of barrier layer 222 near the top surface of polysilicon plug 210. Barrier layer 222 is arranged to reduce the amount of contaminants that diffuse through polysilicon plug 210 during annealing processes, e.g., annealing processes used to achieve desired dielectric properties in stacked capacitor structure 204, as well as the amount of dopants that diffuse out of polysilicon plug 210. In general, barrier layer 222 maintains its integrity during annealing at high temperatures, e.g., processing at temperatures of greater than approximately 900 degrees Centigrade. That is, barrier layer 222 maintains a low contact resistance while enabling a large process window for annealing dielectric material, e.g., annealing high dielectric layer 218.

The overall dimensions, e.g., thickness, of layers and sub-components in stacked capacitor structure 204 may generally be widely varied. The thickness of each layer within stacked capacitor structure 204 may depend upon the application in which stacked capacitor structure 204 is to be used. For example, the thicknesses of the layers will generally be smaller for 0.175 micron DRAM generation than for 0.25 micron DRAM generation. In one embodiment, the polysilicon plug may have a thickness in the range of approximately 1000 Angstroms to approximately 10,000 Angstroms.

As mentioned earlier, in stacked capacitor structures without barrier layers, or films, the amount of dopant which diffuses, or migrates, out of a doped polysilicon plug during annealing processes at temperatures of greater than approximately 800 degrees Centigrade has been observed as being greater than approximately 50 percent, as for example in the range of approximately 50 percent to approximately 70 percent, of the total amount of dopant in the doped polysilicon plug. With the use of barrier layers, the amount of dopant which diffuses out of a doped polysilicon plug may be reduced by a factor in the range of approximately 3 to approximately 10 times. That is, dopant diffusion when barrier layers are used may be in the range of approximately 3 to approximately 10 times less than dopant diffusion when barrier layers are not used.

Figure 3:
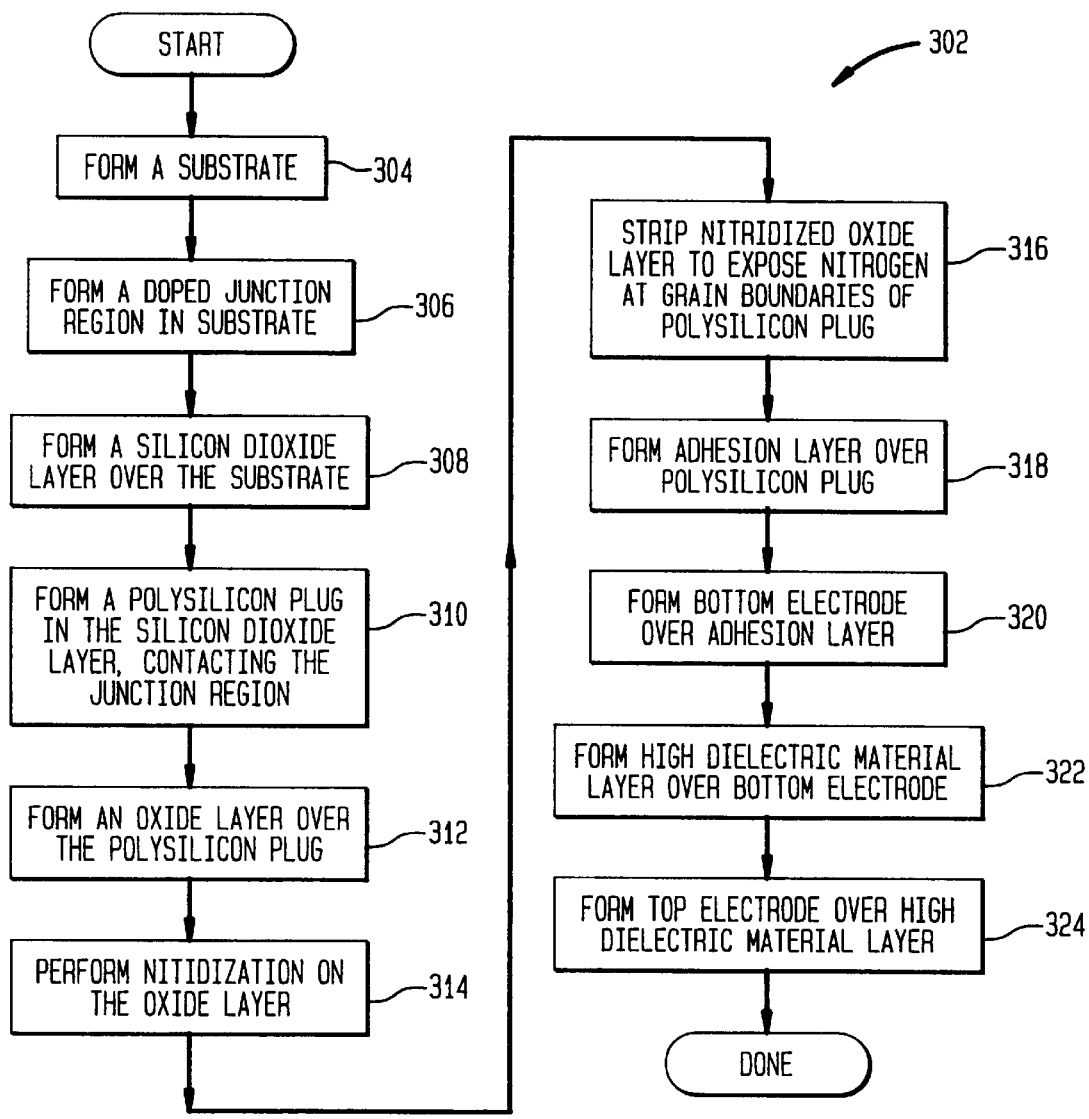
FIG. 3 is a process flow diagram which illustrates the steps associated with one method of fabricating a stacked capacitor structure with a barrier layer in accordance with an embodiment of the present invention.

FIG. 3 is a process flow diagram which illustrates the steps associated with one process which may be used to fabricate a stacked capacitor structure, e.g., stacked capacitor structure 204 of FIG. 2, which includes a barrier layer, in an integrated circuit in accordance with an embodiment of the present invention. The process 302 begins at step 304 where a substrate, e.g., a semiconductor wafer substrate, is formed. The substrate may generally be formed from silicon, and typically includes junction regions. The substrate may further include other layers which are associated with the overall formation of an integrated circuit. Such layers may include, but are not limited to, conducting layers and oxide layers.

After the substrate is formed, a doped junction region is formed in step 306. Then, process flow moves to step 308 where a silicon dioxide layer is formed. The silicon dioxide layer may be grown using any suitable method. In one embodiment, the silicon dioxide layer is grown using chemical vapor deposition techniques. In step 310, a polysilicon plug is formed over the substrate or, more particularly, through the oxide layer. In one embodiment, the polysilicon plug may be doped using any suitable method, such as in situ doping or implantation of a dopant followed by an annealing process, as will be appreciated by those skilled in the art. While any suitable process may be used to from the polysilicon plug, the polysilicon plug is often formed by a conformal low pressure chemical vapor deposition (LPCVD) followed by planarization using a chemical mechanical polish (CMP) process or a recess etch process, as will be appreciated by those skilled in the art. Although the polysilicon plug is generally essentially a single layer of polysilicon, in some embodiments, the polysilicon plug may, instead, include a plurality of polysilicon layers with barrier layers formed therebetween, as will be described in more detail below with respect to FIG. 4.

After the polysilicon plug is formed, an oxide layer is formed, e.g., grown, over the polysilicon plug in step 312. The oxide layer, which may be a silicon dioxide layer, may be grown on the surface, i.e., the top surface, of the polysilicon plug using any one of a number of suitable methods. Typically, the oxide layer may be grown using a rapid thermal oxidation (RTO in oxygen at a temperature in the range of approximately 900 degrees Centigrade to approximately 1100 degrees Centigrade, as for example approximately 925 degrees Centigrade, for a time duration in the range of approximately 30 seconds to approximately 120 seconds, as for example approximately 60 seconds. While the thickness of the oxide layer may be widely varied, in one embodiment, the thickness of the oxide layer is in the range of approximately 40 Angstroms to approximately 100 Angstroms.

Process flow proceeds from step 312 to step 314 in which a nitridization process is performed on the oxide layer that was grown over the polysilicon plug. In other words, the oxide is nitridized. Oxide may generally be nitridized using any suitable method, such as a rapid thermal nitridization (RTN) using ammonia ($NH_3$) at a temperature in the range of approximately 900 degrees Centigrade to approximately 1100 degrees Centigrade, e.g., approximately 1050 degrees Centigrade, for a duration in the range of approximately 20 seconds to 120 seconds, e.g., approximately 30 seconds.

When the oxide layer is nitridized, oxynitride, e.g., silicon oxynitride, forms on the surface of the polysilicon plug and nitride, e.g., silicon nitride, forms at the grain boundaries of the polysilicon plug. That is, a silicon oxynitride film forms at the interface between the oxide layer and at the grain boundaries of the underlying polysilicon plug. In general, nitrogen diff-uses along the grain boundaries of the polysilicon plug. In some embodiments, as for example when the thickness of the polysilicon plug is relatively thin, nitrogen may permeate substantially the entire polysilicon plug when the oxide layer is nitridized. When nitride permeates substantially the entire polysilicon plug, both vertical and lateral diffusion, e.g., diffusion of dopants and contaminants, through the polysilicon plug may be significantly reduced.

After the nitridization on the oxide layer is completed in step 314, the nitridized oxide layer is stripped, or otherwise etched, to expose nitrogen at the grain boundaries of the polysilicon plug in step 316. The exposed nitrogen at the grain boundaries at the surface of the polysilicon plug forms a barrier layer which prevents diffusion in a vertical direction through the polysilicon plug. It should be appreciated that the barrier layer may also reduce the amount of diffusion in a lateral direction.

An adhesion layer is formed over the polysilicon plug in step 318, and a bottom electrode is formed over the adhesion layer in step 320. As mentioned above, the adhesion layer essentially holds the bottom electrode in place with respect to the substrate. After the bottom electrode is formed, e.g., deposited and patterned, an insulating layer is formed over the bottom electrode in step 322. The insulating layer is generally formed from a dielectric material that has a high dielectric constant, as will be appreciated by those skilled in the art.

In one embodiment, the high dielectric material layer is conformally deposited over the bottom electrode and portions of the silicon dioxide layer, which was formed in step 308. The high dielectric material layer serves to insulate the bottom electrode from a top electrode which is formed, e.g., conformally deposited, over the high dielectric material layer in step 324. After the top electrode is formed, the process of forming a stacked capacitor structure is completed.

Figure 4:
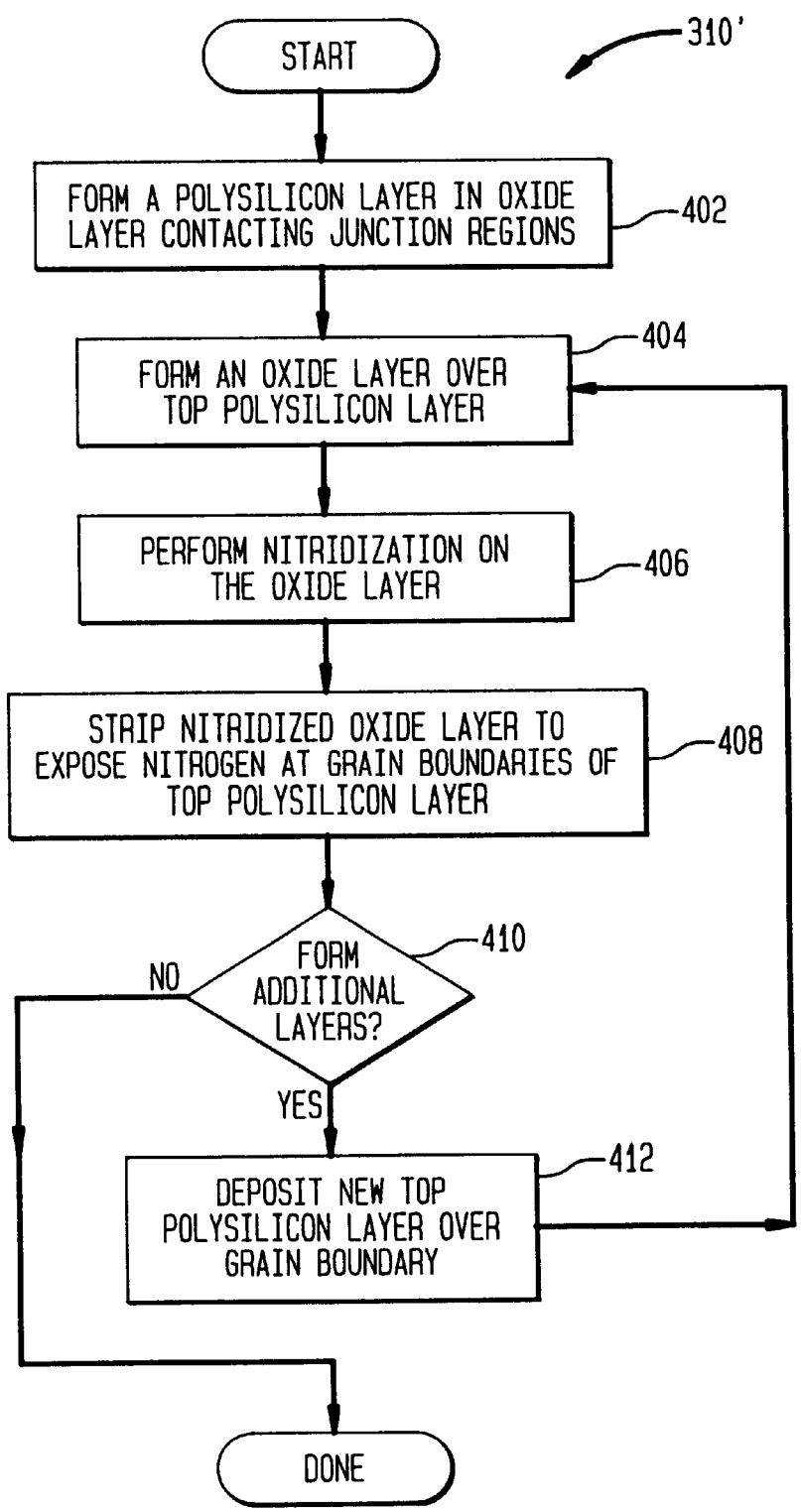
FIG. 4 is a process flow diagram which illustrates the steps associated with the formation of a layered polysilicon plug in accordance with an embodiment of the present invention.

Referring next to FIG. 4, the steps associated with forming a layered polysilicon plug will be described in accordance with the present invention. In other words, one embodiment of step 310 of FIG. 3 will be described. As previously mentioned, although a polysilicon plug may be formed from essentially a single layer of polysilicon, a polysilicon plug may also have a layered structure. In particular, a polysilicon plug may be formed with a plurality of polysilicon layers and barrier layers arranged between the polysilicon layers.

The process of forming a layered polysilicon plug 310' begins at step 402 in which a polysilicon layer is formed over the gate oxide layer. An oxide layer, e.g., a silicon dioxide layer, is formed over the polysilicon layer in step 404. The oxide layer may be grown on the surface of the polysilicon layer using a method such as an RTO in oxygen at a temperature in the range of approximately 900 degrees Centigrade to approximately 1100 degrees Centigrade for a time duration in the range of approximately 30 seconds to approximately 120 seconds. While the thickness of the oxide layer may be widely varied, in one embodiment, the thickness of the oxide layer is in the range of approximately 40 Angstroms to approximately 1000 Angstroms.

After the oxide layer is formed over the polysilicon layer in step 404, a nitridization process is performed on the oxide layer in step 406. As described above, oxide may be nitridized using a method such as an RTN using ammonia ($NH_3$) at a temperature in the range of approximately 900 degrees Centigrade to approximately 1100 degrees Centigrade, for a duration in the range of approximately 20 seconds to 120 seconds. When the oxide layer is nitridized, oxynitride, e.g., silicon oxynitride, forms on the surface of the polysilicon layer and nitride, e.g., silicon nitride, forms at the grain boundaries of the polysilicon layer. That is, a silicon oxynitride film forms at the interface between the oxide layer and the underlying polysilicon layer.

After the nitridization on the oxide layer is completed in step 406, the nitridized oxide layer is etched to expose nitrogen at the grain boundaries of the polysilicon layer in step 408. The exposed nitrogen at the grain boundaries, especially the grain boundaries near the top surface of the polysilicon layer, forms a barrier film, or layer, which prevents diffusion in a vertical direction through and into the polysilicon layer. The barrier layer may also reduce the amount of diffusion in a lateral direction.

In step 410, a determination is made regarding whether additional polysilicon layers are to be formed over the new polysilicon layer. If the determination is that additional polysilicon layers are to be formed, then the indication is that a thicker polysilicon plug is desired. In one embodiment, a thicker polysilicon plug may be used to provide a plurality of barrier layers in a stacked capacitor structure to further reduce the amount of both vertical and lateral diffusion within the stacked capacitor structure. If a layered silicon plug is desired, another polysilicon layer is deposited over the grain boundaries at the top surface of the previously deposited polysilicon layer and, hence, the barrier layer. This new, "top" polysilicon layer is effective to essentially "sandwich" the first barrier layer.

If the determination in step 412 is that at least one additional polysilicon layer is to be formed over the existing polysilicon layers, then process flow returns to step 404 where an oxide layer is formed over the top, new polysilicon layer. Alternatively, when the determination is that no additional polysilicon layers are to be formed, then the process of fabricating a layered polysilicon plug is completed.

Figure 5:
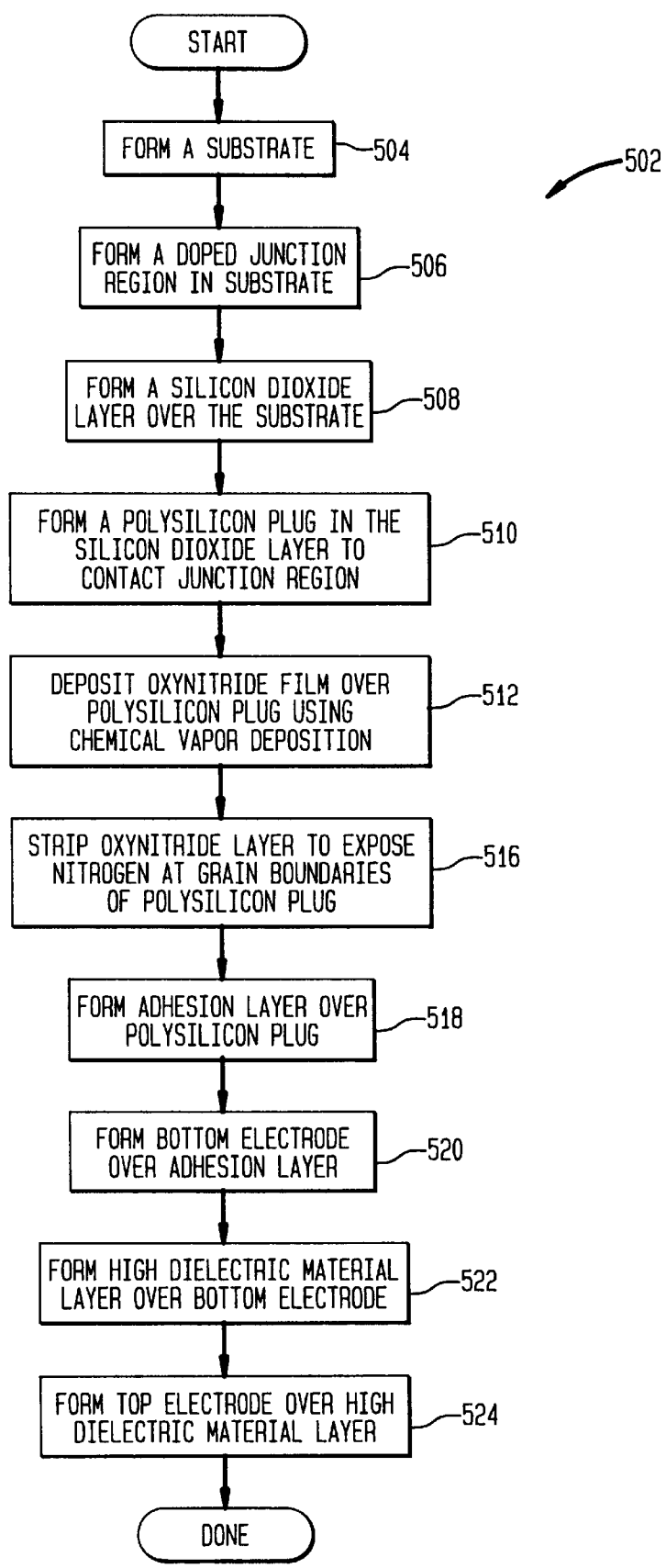
FIG. 5 is a process flow diagram which illustrates the steps associated with a second method of fabricating a barrier layer in a stacked capacitor structure in accordance with an embodiment of the present invention.

While the fabrication of a barrier layer over a polysilicon plug has been described in terms of using a nitridization process, the barrier layer may generally be created using any suitable process. By way of example, chemical vapor deposition (CVD) processes may be used in the formation of barrier layers. FIG. 5 is a process flow diagram which illustrates the steps associated with a second process that may be used to fabricate a gate structure that includes a barrier layer will be described in accordance with an embodiment of the present invention. The process 502 begins at step 504 in which a substrate is formed. The substrate may include various layers associated with the overall formation of an integrated circuit of which the stacked capacitor is a part.

After the substrate is formed, a doped junction region is formed in step 506. From step 506, process flow moves to step 508 in which an oxide layer is formed over the substrate. In step 510, a polysilicon plug is formed through the oxide layer to contact the underlying doped junction region. In one embodiment, the polysilicon plug may be doped using any suitable method, such as in situ doping or implantation of a dopant followed by an annealing process, as will be appreciated by those skilled in the art. In one embodiment, the polysilicon plug is includes a plurality of polysilicon layers with barrier layers disposed between the polysilicon layers.

In step 512, an oxynitride film is deposited over the silicon layer using a CVD process. As will be appreciated by those skilled in the art, a variety of different CVD processes, including low pressure chemical vapor deposition (LPCVD) and plasma enhanced chemical vapor deposition (PECVD), may be used to deposit the oxynitride film.

The oxynitride layer is stripped, or otherwise etched, to expose nitrogen at the grain boundaries near the top surface of the polysilicon plug in step 516. The exposed nitrogen at the grain boundaries form a barrier layer which prevents dopant diffusion in a vertical direction through and from the underlying polysilicon plug. An adhesion layer is formed over the polysilicon plug in step 518, and a bottom electrode is formed over the adhesion layer in step 520.

After the bottom electrode is formed, an insulating layer is formed over the bottom electrode in step 522. The insulating layer is generally formed from a dielectric material that has a high dielectric constant. The high dielectric material layer may be conformally deposited over the bottom electrode and portions of the silicon dioxide layer, which was formed in step 508. The high dielectric material layer is arranged to provide insulation between the bottom electrode from a top electrode which is formed, e.g., conformally deposited, over the high dielectric material layer in step 524. After the top electrode is formed, the second process of forming a stacked capacitor structure which includes a barrier layer is completed.

Although only a few embodiments of the present invention have been described, it should be understood that the present invention may be embodied in many other specific forms without departing from the spirit or the scope of the invention. By way of example, steps involved with fabricating a stacked capacitor structure which includes a barrier layer may reordered, removed or added. In general, steps involved with the methods of the present invention may be reordered, removed, or added without departing from the spirit or the scope of the present invention.

A stacked capacitor structure which includes a barrier layer has been described as being suitable for use in the fabrication of an integrated circuit such as a dynamic random access memory (DRAM). In general, however, the stacked capacitor structure which includes a barrier layer may be suitable for use in a variety of other applications.

Although the growth of silicon dioxide as a silicon dioxide layer formed over a gate oxide layer and the growth of silicon dioxide for use in a nitridizing process have been described as occurring separately, it should be appreciated that, in one embodiment, silicon dioxide may be grown for both purposes substantially simultaneously. In other words, silicon dioxide may be formed over a polysilicon plug at substantially the same time that silicon dioxide is being formed around the polysilicon plug without departing from the spirit or the scope of the present invention.

The materials used in the fabrication of a stacked capacitor structure may also be widely varied. By way of example, while a polysilicon plug, which may or may not be doped, has been described as suitable for use with the present invention, it should be appreciated that other types of silicon may also be used to form the plug. Other types of silicon include, but are not limited to, amorphous or sputtered silicon. The other types of silicon may either be doped or undoped.

In general, a layered polysilicon plug structure may include any number of different polysilicon layers. The number of polysilicon layers in the polysilicon plug is generally dependent upon the overall desired thickness of the plug, as well as the thickness of the individual layers and the barrier layers. The overall thickness of the polysilicon plug may be widely varied. By way of example, the thickness may be in the range of approximately 1000 Angstroms to approximately 1500 Angstroms. Similarly, the thicknesses of the polysilicon layers and the barrier layers within the plug may also be widely varied. In one embodiment, the thickness of each polysilicon layer may be in the range of approximately 100 Angstroms to approximately 500 Angstroms.

The creation of a barrier layer has been described as using either an oxide layer which is nitridized then etched, or an oxynitride layer which is deposited using a process such as CVD then etched. However, it should be appreciated that any suitable method may generally be used to create a STET layer consisting of nitride at grain boundaries within a layered silicon structure without departing from the spirit or the scope of the present invention.

Further, although a layered polysilicon plug has been described as including barrier layers formed using nitridization processes, the barrier layers in a layered polysilicon plug may also be formed using CVD processes without departing from the spirit or the scope of the present invention. Therefore, the present examples are to be considered as illustrative and not restrictive, and the invention is not to be limited to the details given herein, but may be modified within the scope of the appended claims along with their full scope of equivalents.

What is claimed is:

1. A method for reducing outdiffusion within an integrated circuit, the method comprising:

forming a junction region within a substrate;

forming a first oxide layer over the substrate;

forming a silicon plug through the first oxide layer, wherein the silicon plug contacts the junction region;

forming a barrier film over the silicon plug, wherein the barrier film comprises nitrogen at grain boundaries of the barrier film; and forming a dielectric layer over the first oxide layer.

2. A method as recited in claim 1 wherein forming the first barrier film includes:

forming a second oxide layer over the silicon plug;

nitridizing the second oxide layer; and etching the nitridized second oxide layer, wherein etching the nitridized second oxide layer exposes nitride at grain boundaries of the silicon plug to form the barrier film.

3. A method as recited in claim 2 wherein:

forming the second oxide layer includes growing the second oxide layer at a first process temperature in the range of approximately 900 degrees Centigrade to approximately 1100 degrees Centigrade; and nitridizing the second oxide layer includes nitridizing the second oxide layer at a second process temperature in the range of approximately 900 degrees Centigrade to approximately 1100 degrees Centigrade.

4. A method as recited in claim 1 wherein forming the silicon plug includes:

depositing a first doped silicon layer over the junction region;

forming the barrier film over the first doped silicon layer which comprises forming a third oxide layer over the first doped silicon layer, nitridizing the third oxide layer, and etching the third nitridized oxide layer, wherein etching the nitridized third oxide layer exposes nitride at grain boundaries of the first doped silicon layer; and depositing a second silicon layer over the nitride exposed at the grain boundaries of the first doped silicon layer.

5. A method of claim 1 wherein forming the first barrier film includes:

performing a chemical vapor deposition to form an oxynitride film over the silicon plug; and etching the oxynitride film, wherein etching the oxynitride film exposes nitride at grain boundaries of the barrier film.

6. A method as recited in claim 1 further including:

forming an adhesion layer over the first barrier film;

forming a first electrode over the adhesion layer, wherein the dielectric layer formed over the first oxide layer is formed over the first electrode; and forming a second electrode over the dielectric layer.

7. A method of fabricating an integrated circuit comprising:

providing a substrate having a junction region and an insulating layer formed on the substrate, the insulating layer includes a plug which contacts the junction region;

forming a barrier film over the plug, wherein the barrier layer comprises nitrogen at grain boundaries of the barrier film; and forming a dielectric layer over the insulating layer and barrier film.

8. The method as recited in claim 7 wherein the plug comprises silicon.

9. The method as recited in claim 8 wherein the dielectric layer comprises a high dielectric layer.

10. The method as recited in claim 9 wherein the high dielectric layer is selected from a group consisting of PZT, SBT, and BST.

11. The method as recited in claim 7 wherein the plug comprises doped silicon.

12. The method as recited in claim 11 wherein the dielectric layer comprises a high dielectric layer.

13. The method as recited in claim 12 wherein the high dielectric layer is selected from a group consisting of PZT, SBT, and BST.

14. The method as recited in claim 7 wherein the dielectric layer comprises a high dielectric layer.

15. The method as recited in claim 14 wherein the high dielectric layer is selected from a group consisting of PZT, SBT, and BST.

16. The method as recited in claim 15 wherein the plug comprises silicon.

17. The method as recited in claim 15 wherein the plug comprises doped silicon.

18. The method as recited in claim 7, 8, 9, 10, 11, 12, 13, 14, 15, 16, or 17 wherein the grain boundaries of the barrier film comprise an upper portion of the silicon plug.

19. The method as recited in claim 18 wherein forming the barrier film comprises:

forming an oxide layer over the plug;

nitridizing the oxide layer;

etching the nitridized oxide layer to expose nitrogen at the grain boundaries of the upper portion of the plug.

20. The method as recited in claim 19 wherein nitridizing the oxide layer comprises a rapid thermal nitridization.

21. The method as recited in claim 20 further comprises forming a bottom electrode prior to forming the dielectric layer, the bottom electrode is formed over the insulating layer and contacts the plug.

22. The method as recited in claim 21 further comprises forming a second electrode over the dielectric layer, wherein the bottom electrode, the dielectric layer and the second electrode from a capacitor.

23. The method as recited in claim 22 comprises forming an adhesion layer, the adhesion layer located between the bottom electrode and the silicon plug.

24. The method as recited in claim 19 further comprises forming a bottom electrode prior to forming the dielectric layer, the bottom electrode is formed over the insulating layer and contacts the plug.

25. The method as recited in claim 24 further comprises forming a second electrode over the dielectric layer, wherein the bottom electrode, the dielectric layer and the second electrode from a capacitor.

26. The method as recited in claim 25 comprises forming an adhesion layer, the adhesion layer located between the bottom electrode and the silicon plug.

27. The method as recited in claim 18 further comprises forming a bottom electrode prior to forming the dielectric layer, the bottom electrode is formed over the insulating layer and contacts the plug.

28. The method as recited in claim 27 further comprises forming a second electrode over the dielectric layer, wherein the bottom electrode, the dielectric layer and the second electrode from a capacitor.

29. The method as recited in claim 28 comprises forming an adhesion layer, the adhesion layer located between the bottom electrode and the silicon plug.

30. The method as recited in claim 19, 20, 21, 22, 23, 24, 25, 26, 27, 28, or 29 wherein forming the barrier layer comprises:

forming an oxide layer over the plug;

nitridizing the oxide layer;

etching the nitridized oxide layer to expose nitrogen at the grain boundaries of the upper portion of the plug.

31. The method as recited in claim 30 wherein nitridizing the oxide layer comprises a rapid thermal nitridization.

32. The method as recited in claim 31 further comprises forming a bottom electrode prior to forming the dielectric layer, the bottom electrode is formed over the insulating layer and contacts the plug.

33. The method as recited in claim 32 further comprises forming a second electrode over the dielectric layer, wherein the bottom electrode, the dielectric layer and the second electrode from a capacitor.

34. The method as recited in claim 33 comprises forming an adhesion layer, the adhesion layer located between the bottom electrode and the silicon plug.

35. The method as recited in claim 30 further comprises forming a bottom electrode prior to forming the dielectric layer, the bottom electrode is formed over the insulating layer and contacts the plug.

36. The method as recited in claim 35 further comprises forming a second electrode over the dielectric layer, wherein the bottom electrode, the dielectric layer and the second electrode from a capacitor.

37. The method as recited in claim 36 comprises forming an adhesion layer, the adhesion layer located between the bottom electrode and the silicon plug.

38. The method as recited in claim 19, 20, 21, 22, 23, 24, 25, 26, 27, 28, or 29 further comprises forming a bottom electrode prior to forming the dielectric layer, the bottom electrode is formed over the insulating layer and contacts the plug.

39. The method as recited in claim 38 further comprises forming a second electrode over the dielectric layer, wherein the bottom electrode, the dielectric layer and the second electrode from a capacitor.

40. The method as recited in claim 39 comprises forming an adhesion layer, the adhesion layer located between the bottom electrode and the silicon plug.

* * * * *